United States Patent

Yoshida et al.

Patent Number: 5,479,427
Date of Patent: Dec. 26, 1995

[54] SEMICONDUCTOR LASER AND METHOD OF MANUFACTURING THE SAME

[75] Inventors: Ichiro Yoshida; Tsukuru Katsuyama; Junichi Hashimoto, all of Yokohama, Japan

[73] Assignee: Sumitomo Electric Industries, Ltd., Osaka, Japan

[21] Appl. No.: 196,434

[22] Filed: Feb. 15, 1994

[30] Foreign Application Priority Data

Feb. 15, 1993 [JP] Japan .................................. 5-025424

[51] Int. Cl.$^6$ ............................................ H01S 3/18
[52] U.S. Cl. ............................................ 372/45; 372/44
[58] Field of Search ...................... 372/45, 46, 43, 372/50, 44

[56] References Cited

U.S. PATENT DOCUMENTS

| | | |
|---|---|---|
| 5,105,432 | 4/1992 | Murakami et al. . |
| 5,146,466 | 9/1992 | Hamada et al. ...................... 372/45 |
| 5,146,467 | 9/1992 | Kadowaki et al. . |
| 5,222,090 | 6/1993 | Serreze ............................... 372/45 |
| 5,298,762 | 3/1994 | Ou ..................................... 372/45 |

FOREIGN PATENT DOCUMENTS

| | | |
|---|---|---|
| 0353033 | 1/1990 | European Pat. Off. . |
| 0462816 | 12/1991 | European Pat. Off. . |

OTHER PUBLICATIONS

Yoshida et al., AlGaInP/GaInAs Strained Quantum Well Lasers, Electronic Letters, Apr. 15, 1993, vol. 29, No. 8, pp. 654–655.

Katsuyama et al., OMPVE growth of AlGaInP/Ga$_x$In$_{1-x}$P strained quantum well structures and their applications to visible laser diodes, Journal of Crystal Growth 124 (1992) pp. 697–702. No month for reference.

Primary Examiner—Rodney B. Bovernick
Assistant Examiner—Robert McNutt
Attorney, Agent, or Firm—Cushman Darby & Cushman

[57] ABSTRACT

In a semiconductor laser having a p-type cladding layer consisting of GaInP or AlGaInP, an operating voltage is decreased. In a semiconductor laser formed on a GaAs substrate and having a p-type cladding layer consisting of GaInP or AlGaInP and a p-type contact layer consisting of GaAs or GaInAs, p-type buffer layers are formed between the p-type cladding layer and the p-type contact layer, which consists of a compound containing both arsenic (As) and phosphorus (P) and having a medium bandgap between those of the two layers.

9 Claims, 4 Drawing Sheets

SEMICONDUCTOR LASER AND METHOD OF MANUFACTURING THE SAME

BACKGROUND OF THE INVENTION

1. Field of the Invention

The present invention relates to a semiconductor laser which can be used, for example, to excite an optical amplifier using an Er-doped quartz optical fiber.

2. Related Background Art

Optical amplifiers using Er-doped quartz optical fibers have attracted a great deal of attention as a core technology for an optical communication system of a future generation. As a pump source for the optical amplifier, a semiconductor laser having an operating wavelength of 1.48 or 0.98 μm is used. A 0.98-μm semiconductor laser currently reported has an active layer consisting of GaInAs and a cladding layer consisting of AlGaAs or GaInP.

Semiconductor lasers using AlGaAs as a cladding material have good initial characteristics and high reliability on the average. However, some are suddenly deteriorated when being energized. At present, they cannot be removed by initial screening. To the contrary, such an accidental deterioration is expected to occur less frequently in semiconductor lasers using GaInP or AlGaInP as a cladding material.

However, in the semiconductor lasers using GaInP or AlGaInP as a cladding material, the operating voltage is high and the morphology tends to be degraded.

SUMMARY OF THE INVENTION

It is an object of the present invention to provide a 0.98-μm band semiconductor laser with GaInP or AlGaInP cladding and requires a low operating voltage, and a method of manufacturing the same.

In order to achieve the above object, according to an aspect of the present invention, there is provided a semiconductor laser comprising a. an n-type GaAs substrate, b. an n-type cladding layer formed on the n-type GaAs substrate directly or through a buffer underlayer, c. an active region layer formed on the n-type cladding layer, d. a p-type cladding layer formed on the active region layer, the p-type cladding layer consisting of a material of GaInP or AlGaInP, e. a p-type buffer layer formed on the p-type cladding layer, the p-type buffer layer consisting of a material having a composition containing arsenic (As) and phosphorus (P) and a bandgap smaller than that of the material of the p-type cladding layer, f. a p-type contact layer formed on the p-type buffer layer, the p-type cladding layer consisting of a material of GaAs or GaInAs which has a bandgap smaller than that of the material of the p-type buffer layer, and g. electrodes formed on a lower surface of the n-type GaAs substrate and an upper surface of the p-type contact layer, respectively.

A conventional semiconductor laser having a p-type cladding layer consisting of GaInP or AlGaInP and a p-type contact layer consisting of GaAs or GaInAs has an energy band discontinuity between the contact and the cladding layers. This discontinuity is particularly large on the valence band side. However, the semiconductor laser of the present invention has, between the contact and the cladding layers, a buffer layer consisting of a compound containing both arsenic (As) and phosphorus (P) and having a medium bandgap between those of the two layers. For this reason, the energy band discontinuity becomes moderate, resulting in a low operating voltage.

Generally, defects tend to be caused at the interface between a phosphide and an arsenide. That is, when a cladding layer consisting of GaInP or AlGaInP and a contact layer consisting of GaAs or GaInAs are directly stacked, defects tend to be caused. As in the present invention, however, when a compound containing both arsenic (As) and phosphorus (P) is inserted between the two layers, interface detects are hardly caused and the surface morphology is also improved.

According to another aspect of the present invention, there is provided a semiconductor laser comprising a. a p-type GaAs substrate, b. a p-type buffer layer formed on the p-type GaAs substrate directly or through a buffer underlayer, the p-type buffer layer consisting of a material having a composition containing arsenic (As) and phosphorus (P) and a bandgap larger than that of the p-type GaAs substrate, c. a p-type cladding layer formed on the p-type buffer layer, the p-type cladding layer consisting of a material of GaInP or AlGaInP which has a bandgap larger than that of the p-type buffer layer, d. an active region layer formed on the p-type cladding layer, e. an n-type cladding layer formed on the active region layer, f. an n-type contact layer formed on the n-type cladding layer, and g. electrodes formed on a lower surface of the p-type GaAs substrate and an upper surface of the n-type contact layer, respectively.

Also in this semiconductor laser, the operating voltage is low and interface defects are hardly caused on the basis of the same principle as in the above-described semiconductor laser.

In both the semiconductor lasers according to the present invention, GaInAsP is preferably used as a material of the p-type buffer layer. The composition of the p-type buffer layer is preferably changed such that its bandgap decreases from the p-type cladding layer side to the p-type contact layer or p-type GaAs substrate side.

When the semiconductor laser of the present invention is to be formed on an n-type substrate, in formation of a p-type buffer layer on a p-type cladding layer, the p-type cladding layer is first formed, and then, an arsenic source gas and a group III source gas are supplied while keeping supply of a phosphorus source gas. When the semiconductor laser of the present invention is to be formed on a p-type substrate, in formation of a p-type cladding layer on a p-type buffer layer, supply of an arsenic source gas is stopped while keeping supply of a phosphorus source gas, and at the same time, a group I II source gas is supplied.

According to the manufacturing method of the present invention, when a p-type buffer layer is formed on a p-type cladding layer or when a p-type cladding layer is formed on a p-type buffer layer, a phosphorus (P) source gas is kept supplying so that defects are hardly caused at the interface between the two layers.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

Figure 1:
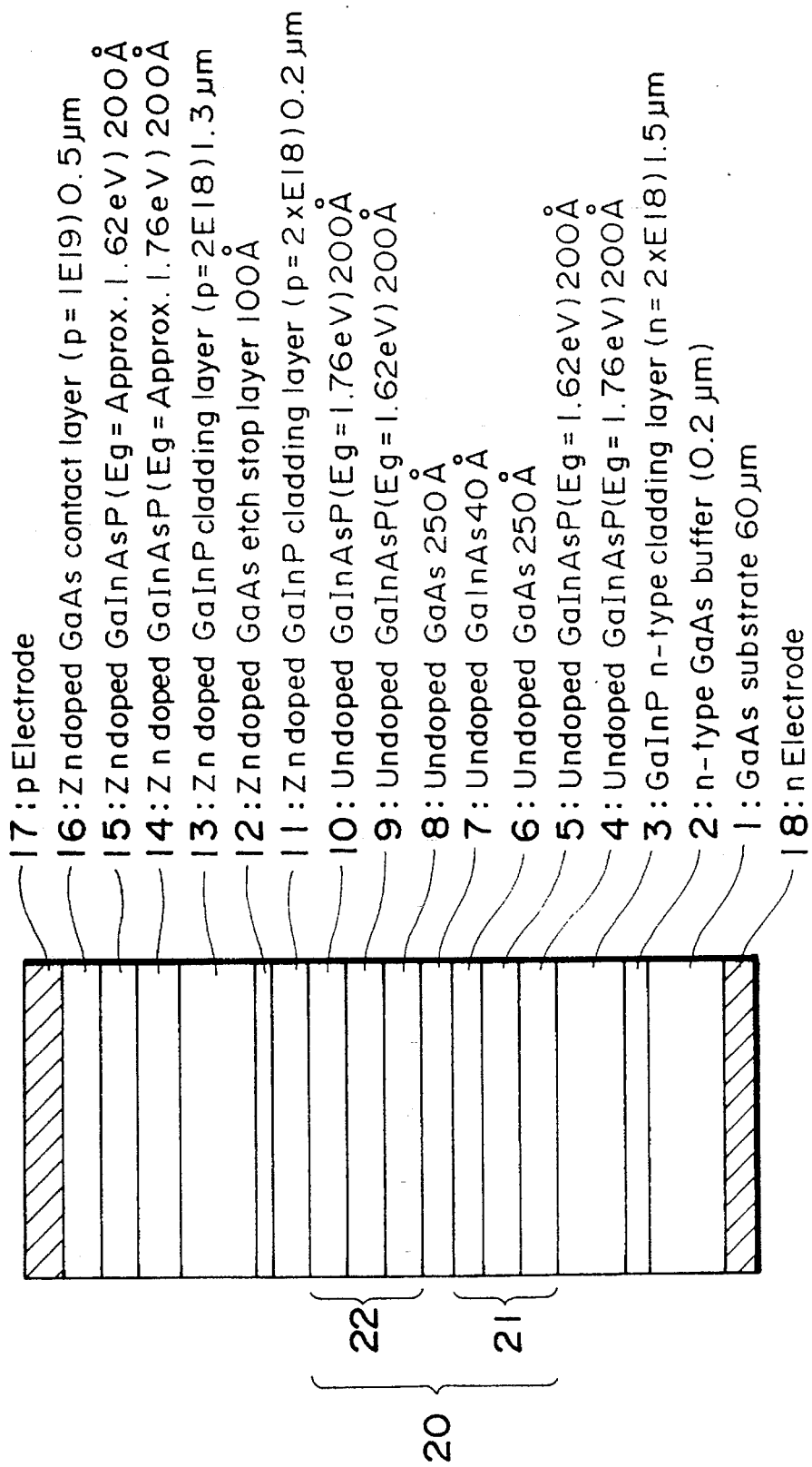
FIG. 1 is a sectional view showing a multilayered structure in the vertical direction of a semiconductor laser according to an embodiment of the present invention.

FIG. 1 is a schematic view showing the structure in the vertical direction of a semiconductor laser according to an embodiment of the present invention. Epitaxial layers 2 to 16 on an n-type GaAs substrate 1 can be formed by a metal organic vapor phase epitaxy method. The materials and thicknesses of the epitaxial layers 2 to 16 are as follows:

1st layer . . . n-type GaAs buffer underlayer 2 having a thickness of 0.2 μm,

2nd layer . . . Si-doped GaInP cladding layer 3 (n=2E18) having a thickness of 1.5 μm, 3rd layer . . . undoped GaInAsP layer 4 (Eg=1.76 eV) having a thickness of 200 Å, 4th layer . . . undoped GaInAsP layer 5 (Eg=1.62 eV) having a thickness of 200 Å, 5th layer . . . undoped GaAs layer 6 having a thickness of 250 Å, 6th layer . . . undoped GaInAs active layer 7 having a thickness of 40 Å, 7th layer . . . undoped GaAs layer 8 having a thickness of 250 Å, 8th layer . . . undoped GaInAsP layer 9 (Eg=1.62 eV) having a thickness of 200 Å, 9th layer . . . undoped GaInAsP layer 10 (Eg=1.76 eV) having a thickness of 200 Å, 10th layer . . . Zn-doped GaInP cladding layer 11 (p=2E18) having a thickness of 0.2 μm, 11th layer . . . Zn-doped GaAs etch-stop layer 12 having a thickness of 100 Å, 12th layer . . . Zn-doped GaInP cladding layer 13 (p=2E18) having a thickness of 1.3 μm, 13th layer . . . Zn-doped GaInAsP first buffer layer 14 (Eg=about 1.76 eV) having a thickness of 200 Å, 14th layer . . . Zn-doped GaInAsP second buffer layer 15 (Eg=about 1.62 eV) having a thickness of 200 Å, and 15th layer . . . Zn-doped GaAs contact layer 16 (p=1E19) having a thickness of 0.5 μm.

In this embodiment, the 3rd layer 4 to the 9th layer are referred to as an active region layer 20. Of the active region layer 20, the 6th layer 7 is an actual active layer and a quantum well layer. The active region layer 20 is formed of an optical confinement layer 21 constituted by the 3rd layer 4 to the 5th layer 6, an optical confinement layer 22 constituted by the 7th layer 8 to the 9th layer 10, and the active layer 7 sandwiched between the optical confinement layers 21 and 22.

The epitaxial wafer of this embodiment was formed by a low-pressure metal organic vapor phase epitaxy method (low-pressure MOVPE method) at 60 Torr. The materials of the layers are as follows. For the GaAs layers 2, 6, 8, 12, and 16, trimethylgallium (TMGa) was used as a group III source, and arsine ($ASH_3$) was used as a group V source. For the GaInAsP layers 4, 5, 9, 10, 14, and 15, trimethylgallium (TMGa) and trimethylindium (TMIn) were used as group III sources, and arsine (ASH3) and phosphine ($PH_3$) were used as group V sources. For the GaInP layers 11 and 13, trimethylgallium (TMGa) and trimethylindium (TMIn) were used as group III sources, and phosphine ($PH_3$) was used as a group V source. For the GaInAs layer 7, trimethylgallium (TMGa) and trimethylindium (TMIn) were used as group III sources, and arsine ($AsH_3$) was used as a group V source. In addition, diethylzinc (DEZn) was used as a p-type dopant, and disilane ($Si_2H_6$) was used as an n-type dopant. These sources and dopants are supplied to a reactor by using hydrogen as a carrier gas. The Si-doped GaAs substrate 1 is placed on a carbon susceptor in the reactor, and heated to a growth temperature in an arsine ($AsH_3$) atmosphere. The above-described source gases corresponding to each layer are appropriately supplied to form the epitaxial wafer. The growth temperature is 700° C. for the cladding layers 3, 11, and 13, and 650° C. for the optical confinement layers 21 and 22, the active layer 7, the buffer layers 2, 14, 15, and 16, and the etch-stop layer 12. This is because, from a view point of crystallinity, a GaInP layer is preferably grown at a relatively high temperature, and a GaInAs layer is preferably grown at a relatively low temperature.

In this embodiment, the process of forming the Zn-doped GaInAsP buffer layers 14 and 15, after the Zn-doped GaInP cladding layer 13 is formed, has some characteristics. This will be described below in detail.

The p-GaInAs buffer layers 14 and 15 are grown in the same conditions as those for the GaInAsP layer 10 used in the optical confinement layer 22, except for the dopant. The flow rate of diethylzinc serving as a source gas of Zn as a p-type dopant is set to the same value as that for the GaInP cladding layers 11 and 13. In this embodiment, the flow rate of diethylzinc for the Zn-doped GaAs contact layer 16 is also the same as this flow rate.

When growth of the Zn-doped GaInP cladding layer 13 is completed, supply of the group III source gases and the dopant (diethylzinc) is stopped while keeping supply of phosphine as a source gas of phosphorus to the reactor. The flow rates of the group I II source gases, however, are changed in a state in which they are not supplied into the reactor, i.e., they are supplied outside the reactor, to prepare for formation of the GaInAsP buffer layer 14. In formation of the GaInAsP layer 14, if the flow rate of phosphine is set to a value different from that for the GaInP cladding layer 13, it is changed when the flow rates of the group III source gases are changed.

The group III source gases, arsine as a source gas of As, and diethylzinc as a dopant are simultaneously supplied to the reactor to form the Zn-doped GaInAsP layer 14 serving as the first buffer layer.

Supply of the group I II source gases is then stopped while keeping supply of arsine and phosphine to the reactor. The flow rates of the group III source gases are switched for the Zn-doped GaInAsP layer 15 serving as the second buffer layer. After the Zn-doped GaInAsP buffer layer 15 is formed, supply of phosphine is stopped and formation of the GaAs contact layer 16 is immediately started. At this time, it is preferable not to stop supply of arsine.

Figure 2:
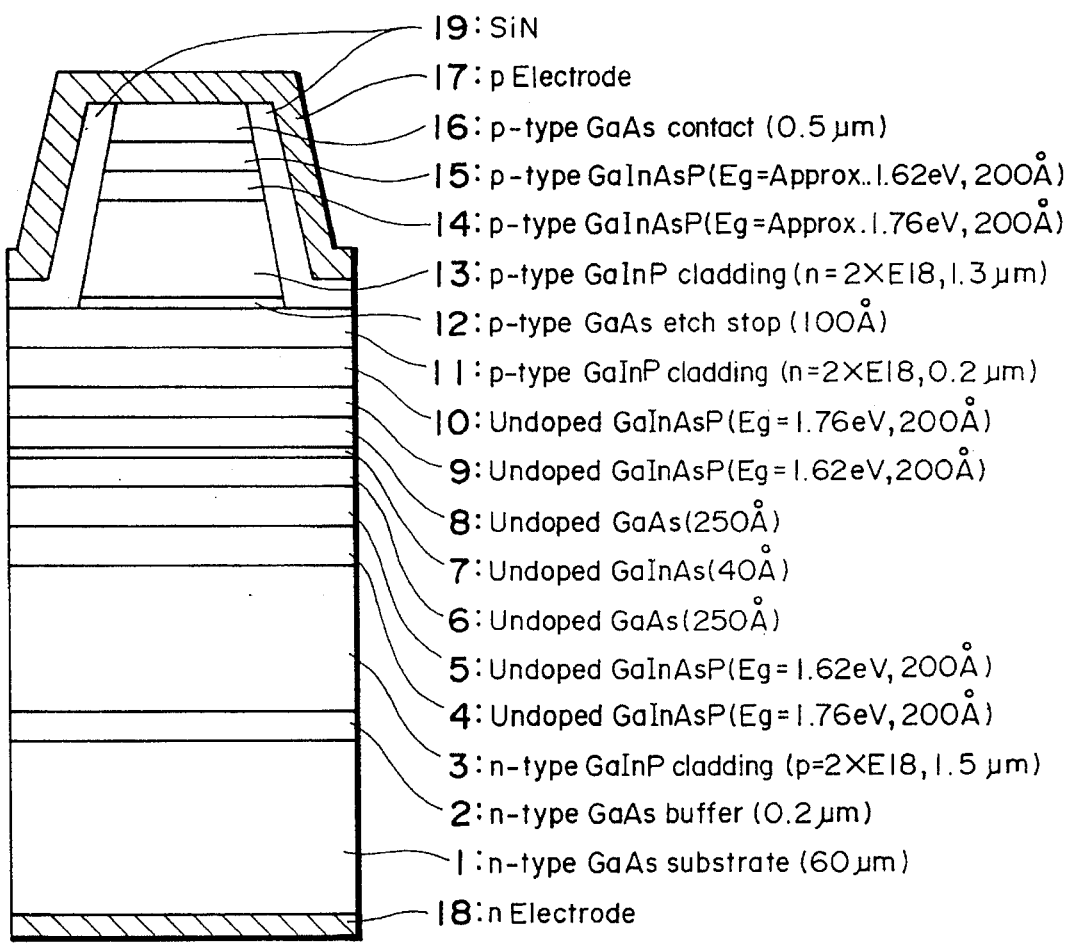
FIG. 2 is a sectional view showing a semiconductor laser device having a stripe structure obtained by mesa-etching a wafer having the multilayered structure shown in FIG. 1.

A device having a nitride film stripe structure as shown in FIG. 2 is formed from the resultant epitaxial wafer (wafer having no electrode 17 or 18 in FIG. 1) according to the following process. FIG. 2 is a schematic view showing the section of the device which has a stripe having a mesa-shaped section in the vertical direction with respect to the drawing surface. A nitride film (SiN film) is deposited by a chemical vapor deposition method (CVD method), and this SiN film is patterned into a stripe-like shape by photolithography. The GaAs contact layer 16 and the GaInAsP buffer layers 15 and 14 are then etched by using the stripe-like SiN film as a mask. As an etchant, for example, phosphoric acid, hydrogen peroxide, and water are used at a ratio of 5:1:40. Further, etching is performed to the GaAs etch-stop layer 12 by using an etchant consisting of hydrochloric acid, phosphoric acid, and water at a ratio of 220:110:165. After the SiN stripe is removed, an SiN film is deposited on the entire surface again, and the upper surface of the mesa portion is removed to form a stripe-like shape by photolithography. A p-type electrode metal 17 is deposited on the upper surface. The GaAs substrate 1 is polished from the lower surface to a thickness of about 60 μm, and an n-type electrode metal 18 is deposited on the lower surface, thereby completing the wafer process. The wafer is then cleaved to form a chip bar having a cleaved surface serving as a resonator mirror. The chips are separated and then mounted by gold/tin soldering.

Figure 3:
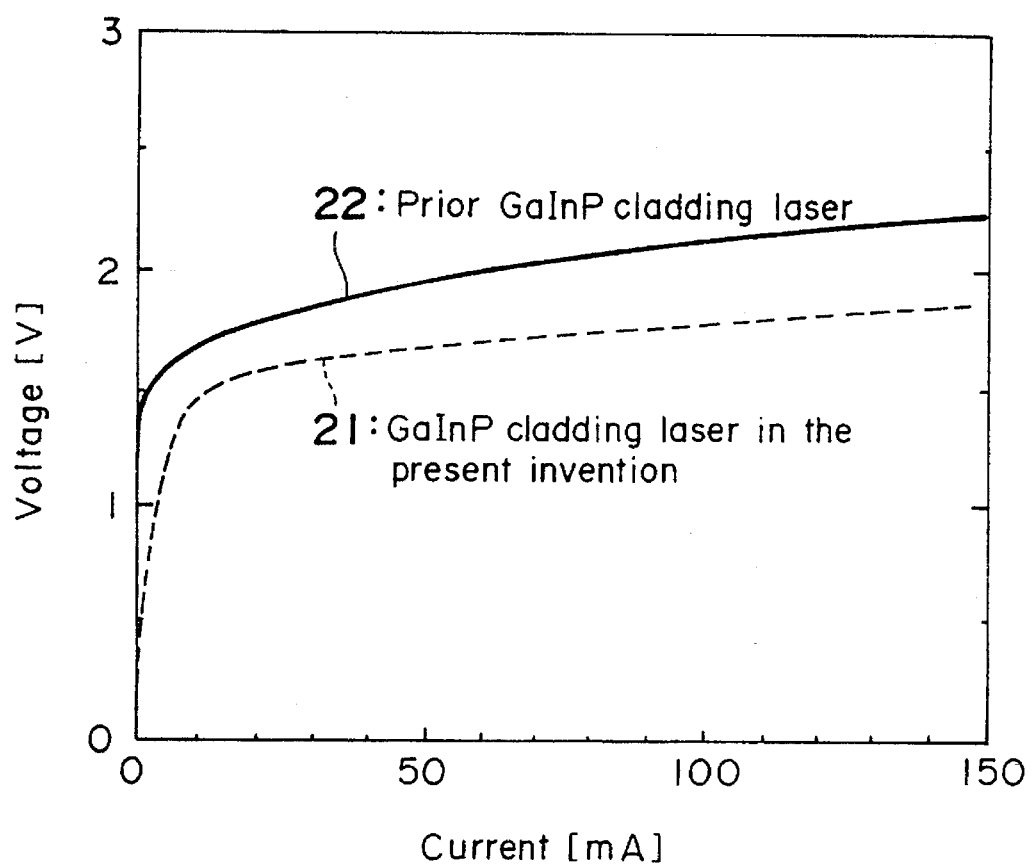
FIG. 3 is a graph showing the operating voltage of a semiconductor laser according to an embodiment of the present invention compared to that of a conventional semiconductor laser.

FIG. 3 is a graph showing the current-voltage characteristics of the semiconductor laser according to an embodiment of the present invention compared to the conventional device. A curve 21 indicates the characteristics of the semiconductor laser according to an embodiment of the present invention, and a curve 22 indicates the characteristics of a conventional semiconductor laser having the same structure as in this embodiment except that the GaInAs buffer layers 14 and 15 are omitted. The semiconductor laser having the characteristics indicated by the curve 22 has only one Zn-doped GaInAsP buffer layer, unlike the embodiment shown in FIG. 1. As is apparent from FIG. 3, in the semiconductor laser according to this embodiment, the voltage is lower than that of the conventional GaInP cladding semiconductor laser (curve 22).

The semiconductor laser according to the embodiment shown in FIG. 1 has two p-type GaInAsP buffer layers, so that it can have a bandgap more moderate than that of a semiconductor laser with one p-type GaInAsP buffer layer. When the number of layers increases, the bandgap becomes more moderate to decrease the operating voltage. In place of such a multilayered structure, one buffer layer having a bandgap which continuously decreases from the cladding side to the contact side may be formed.

In the embodiment shown in FIG. 1, the contact layer consists of GaAs. However, GaInAs may also be used.

When the cladding layers consist of AlGaInP instead of GaInP, a buffer layer may have a multilayered structure. In this case, AlGaInP having a lower Al content or GaInP may be used on the cladding side, and GaInAsP may be used on the contact side.

Figure 4:
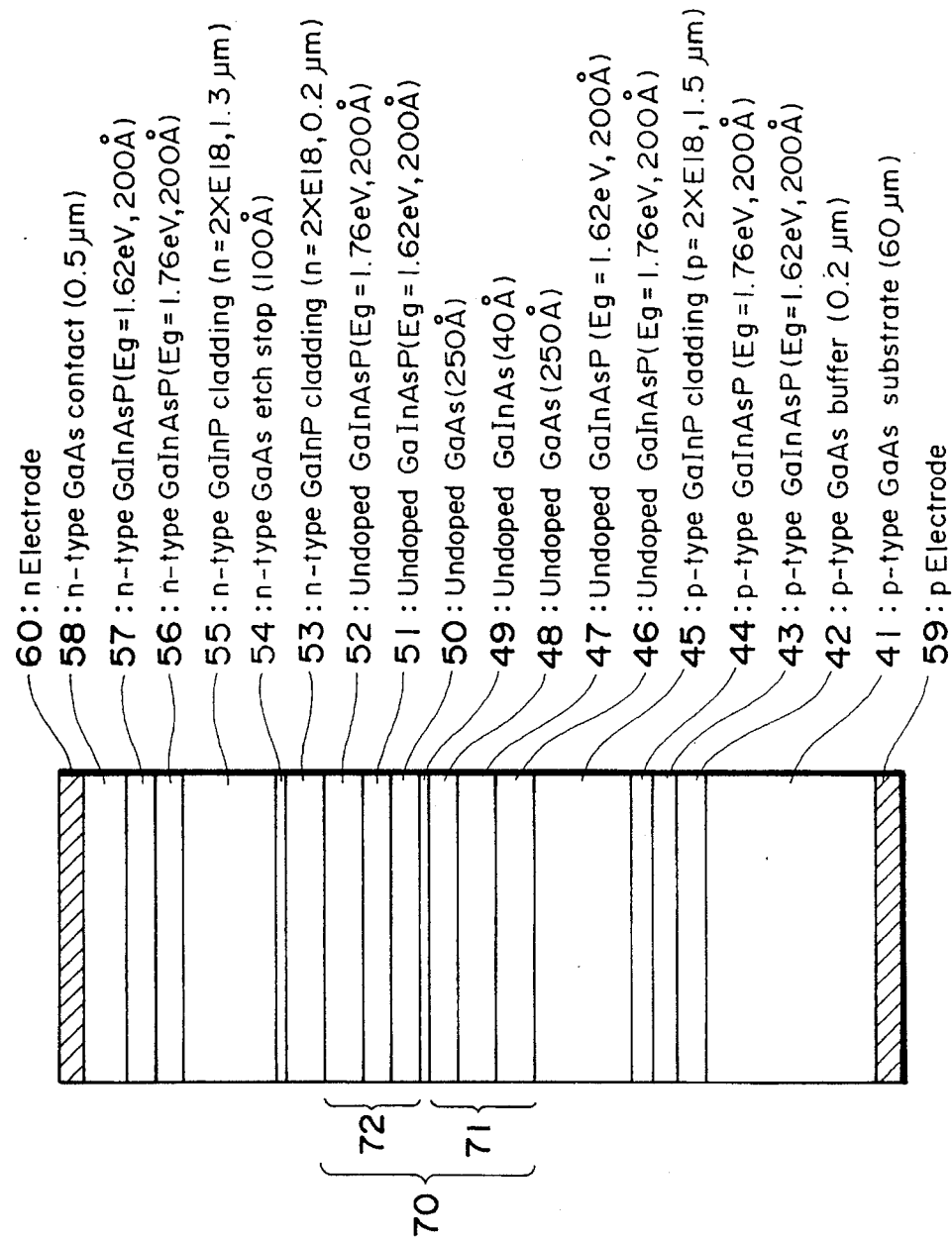
FIG. 4 is a sectional view showing a multilayered structure of a semiconductor laser formed on a p-type GaAs substrate according to the second embodiment of the present invention.

In the above embodiment, an n-type GaAs substrate is used as a substrate. However, a p-type GaAs substrate can be used instead. FIG. 4 is a view showing its embodiment. The p-type buffer layers 14 and 15 in FIG. 1 correspond to p-type buffer layers 43 and 44. In this case, when a cladding layer 45 is grown after the buffer layer 44, supply of an arsenic source gas is stopped while keeping supply of a phosphorus source gas, and at the same time, group III source gases are supplied.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser comprising:
   a. an n-type GaAs substrate,
   b. an n-type cladding layer formed on said n-type GaAs substrate,
   c. an active region layer formed on said n-type cladding layer,
   d. a p-type cladding layer formed on said active region layer, said p-type cladding layer being fabricated from a first material selected from a group comprising GaInP and AlGaInP,
   e. a p-type buffer layer formed on said p-type cladding layer, said p-type buffer layer being fabricated from a second material selected from a material having a composition containing arsenic (As) and said first material used to fabricate said p-type cladding layer,
   f. a p-type contact layer formed on said p-type buffer layer, said p-type contact layer being fabricated from a third material which has a bandgap smaller than a bandgap of said second material used to fabricate said p-type buffer layer, said third material being selected from a group comprising GaAs and GaInAs, and
   g. electrodes formed on a lower surface of said n-type GaAs substrate and an upper surface of said p-type contact layer, respectively,
   wherein a composition ratio of said p-type buffer layer is changed such that the bandgap decreases from said p-type cladding layer to said p-type contact layer.

2. A laser according to claim 1 wherein
   said p-cladding layer consists of AlGaInP,
   said p-type buffer layer is constituted by a cladding-side buffer layer and a contact-side buffer layer,
   said cladding-side buffer layer consists of a material of one of GaInP and AlGaInP having an Al content lower than that of said p-type cladding layer, and
   said contact-side buffer layer consists of GaInAsP.

3. A laser according to claim 1, wherein said p-type buffer layer consists of GaInAsP.

4. A laser according to claim 1, wherein said n-type cladding layer is directly formed on said n-type GaAs substrate.

5. A laser according to claim 1, wherein said n-type cladding layer is formed on said n-type GaAs substrate through a buffer underlayer.

6. A semiconductor laser comprising:
   a. a p-type GaAs substrate,
   b. a p-type buffer layer formed on said p-type GaAs substrate directly or through a buffer underlayer, said p-type buffer layer consisting of a material having a composition containing arsenic (As) and phosphorus (P) and a bandgap larger than that of said p-type GaAs substrate, c. a p-type cladding layer formed on said p-type buffer layer, said p-type cladding layer consisting of a material of one of GaInP and AlGaInP which has a bandgap larger than that of said p-type buffer layer, d. an active region layer formed on said p-type cladding layer, e. an n-type cladding layer formed on said active region layer, f. an n-type contact layer formed on said n-type cladding layer, and g. electrodes formed on a lower surface of said p-type GaAs substrate and an upper surface of said n-type contact layer, respectively.

7. A laser according to claim 6, wherein said p-type buffer layer consists of GaInAsP.

8. A laser according to claim 7, wherein a composition ratio of said p-type buffer layer is changed such that the bandgap decreases from said p-type cladding layer side to said p-type GaAs substrate side.

9. A laser according to claim 8, wherein said p-type cladding layer consists of AlGaInP, said p-type buffer layer is constituted by a cladding-side buffer layer and a substrate-side buffer layer, said cladding-side buffer layer consists of a material of one of GaInP and AlGaInP having an Al content lower than that of said p-type cladding layer, and said substrate-side buffer layer consists of GaInAsP.

* * * * *